United States Patent
Taghizadeh-Kaschani

(10) Patent No.: US 7,457,373 B2
(45) Date of Patent: Nov. 25, 2008

(54) RECEIVER CIRCUIT FOR A PUSH-PULL TRANSMISSION METHOD AND METHOD FOR RECEIVER-END SIGNAL PROCESSING IN PUSH-PULL TRANSMISSION METHODS

(75) Inventor: Karim-Thomas Taghizadeh-Kaschani, Poing (DE)

(73) Assignee: Infineon Technologies AG, Munich (DE)

(*) Notice: Subject to any disclaimer, the term of this patent is extended or adjusted under 35 U.S.C. 154(b) by 715 days.

(21) Appl. No.: 10/669,071

(22) Filed: Sep. 23, 2003

(65) Prior Publication Data
US 2004/0102164 A1 May 27, 2004

(30) Foreign Application Priority Data
Sep. 23, 2002 (DE) ............... 102 44 186

(51) Int. Cl.
*H03K 9/00* (2006.01)
(52) U.S. Cl. ...................... 375/316; 375/224
(58) Field of Classification Search .......... 375/224, 375/286, 287, 316, 359, 360, 354, 266; 327/108
See application file for complete search history.

(56) References Cited

U.S. PATENT DOCUMENTS

| | | | | |
|---|---|---|---|---|
| 4,118,599 A | * | 10/1978 | Iwahara et al. | ........... 381/1 |
| 4,953,070 A | * | 8/1990 | Lenz | ........... 363/58 |
| 5,365,118 A | * | 11/1994 | Wilcox | ........... 327/109 |
| 5,541,541 A | * | 7/1996 | Salamina et al. | ........... 327/108 |
| 5,591,967 A | * | 1/1997 | Moake | ........... 250/252.1 |
| 6,104,331 A | * | 8/2000 | Ishida et al. | ........... 341/155 |
| 6,519,322 B1 | * | 2/2003 | Ludeman | ........... 379/27.01 |
| 2001/0026490 A1 | * | 10/2001 | Nakagawa | ........... 365/207 |
| 2002/0130698 A1 | * | 9/2002 | Yoshida et al. | ........... 327/362 |

FOREIGN PATENT DOCUMENTS

EP    0 529 602 A2    3/1993

* cited by examiner

*Primary Examiner*—Emmanuel Bayard
(74) *Attorney, Agent, or Firm*—Laurence A. Greenberg; Werner H. Stemer; Ralph E. Locher

(57) ABSTRACT

A receiver circuit contains first and second inputs for feeding in first and second input signals, and an output generating an output signal dependent on the input signals. A detector circuit has a first and second signal detectors connected to the first and second inputs, respectively. The signal detectors compare amplitudes of the input signals in each case with a detection threshold and in each case provide a detector output signal. The signal detectors each have a control input for setting the detection threshold, and the control input of the first signal detector is coupled to an output of the second signal detector and the control input of the second signal detector is coupled to an output of the first signal detector. A signal processing circuit receives the detector output signals and generates the output signal according to the detector output signals.

13 Claims, 10 Drawing Sheets

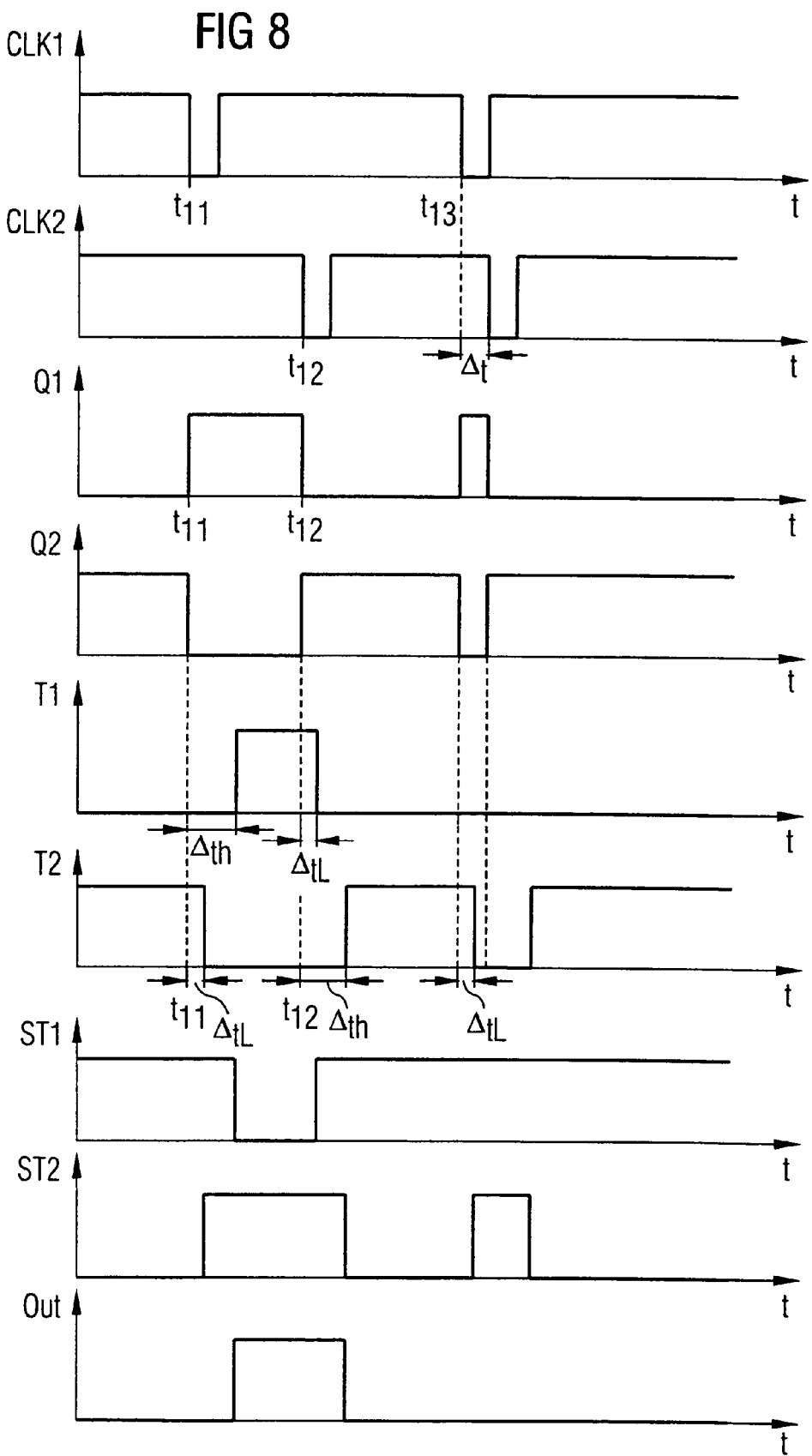

RECEIVER CIRCUIT FOR A PUSH-PULL TRANSMISSION METHOD AND METHOD FOR RECEIVER-END SIGNAL PROCESSING IN PUSH-PULL TRANSMISSION METHODS

BACKGROUND OF THE INVENTION

Field of the Invention

The present invention relates to a receiver circuit for a push-pull transmission method and a method for receiver-end signal processing in push-pull transmission methods.

In order to provide a better understanding of the invention that is explained below, first the basic mode of operation of a push-pull transmission method is explained with reference to FIGS. 1 and 2.

FIG. 1 shows an exemplary embodiment of a push-pull transmission configuration. The basic principle of push-pull transmission relates to generating two complementary transmission signals TXIn1, TXIn2 from an input signal In and transmitting the transmission signals TXIn1, TXIn2 via separate channels. In the circuit in accordance with FIG. 1, the transmission signals TXIn1, TXIn2 are generated from the input signal In by a transmitter circuit 110. The transmission parts in each case contain a driver circuit 121, 122 and a transformer 131, 132 driven by the driver circuit as a transmission element. The transformers 131, 132 serve to electrically isolate the transmitter end and the receiver end of the transmission path from one another. The transformers 131, 132 are coreless transformers, for example, which can be integrated in a semiconductor chip in a space-saving manner. The primary coils of the transformers are fed signals TXOut1 and TXOut2, respectively, which are generated from the complementary transmission signals TXIn1, TXIn2 in the drivers 121, 122. Reception signals RXIn1, RXIn2 resulting from the primary-side signals TXOut1, TXOut2 are available at the secondary coils of the transformers 131, 132.

The signals present at the outputs of the transmission channels RXIn1, RXIn2 are detected by detector circuits 141, 142, detector output signals S141, S142 being fed to a receiver logic unit 150 for providing an output signal Out dependent on the input signal In.

In order to transmit a two-value input signal In by a push-pull method via channels with potential barriers such as transformers, for example, it is known to convert a rising edge of the input signal In into a pulse on one of the two channels and a falling edge into a pulse on the other of the two channels, so that, during the transmission of such a two-value input signal In, pulses are never transmitted simultaneously on both channels. This is utilized for filtering out interference signals since it can be assumed that such interference signals are common-mode signals, that is to say signals which are present simultaneously on both channels, the receiver circuit 10 being configured to the effect that, in the event of simultaneous detection of reception signals on both channels, it ignores these signals and leaves the output signal Out correspondingly unchanged.

FIG. 2 shows by way of example the signal profile in the case of such a push-pull transmission method, the input signal In and the pulses resulting from the input signal in the reception signals RXIn1, RXIn2 and also the resulting output signal Out being illustrated in FIG. 2. In the example, the reception signals RXIn1, RXIn2 additionally contain an interference pulse that, however, occurs simultaneously on both channels and is therefore filtered out in the reception circuit 150.

In principle, the circuit components of a push-pull transmission path must enable interference and useful signals to be distinguished unequivocally and ignore interference signals, in which case the transmission speed should be as high as possible, that is to say that the signal propagation times in the individual circuit components should be as low as possible, and the transmission configuration should be able to be realized as cost-effectively as possible.

Difficulties in the suppression of interference signals can occur when interference signals which occur simultaneously on the two channels have differences in amplitude, so that the interference signal on one of the channels lies above a detection threshold and the interference on the other channel lies below a detection threshold, a useful signal transmission being assumed incorrectly at the receiver end. Problems can also arise when the interference signals on the two channels occur with a slight temporal offset with respect to one another.

SUMMARY OF THE INVENTION

It is accordingly an object of the invention to provide a receiver circuit for a push-pull transmission method and a method for receiver-end signal processing in push-pull transmission methods that overcome the above-mentioned disadvantages of the prior art devices and methods of this general type, the receiver circuit and the method being robust with respect to interference signals that occur during the signal transmission and the receiver circuit additionally being able to be realized simply and cost-effectively.

With the foregoing and other objects in view there is provided, in accordance with the invention, a receiver circuit for a push-pull transmission method. The receiver circuit contains a first input for receiving a first input signal, a second input for receiving a second input signal, an output providing an output signal dependent on the first and second input signals, and a detector circuit having a first signal detector connected to the first input and a second signal detector connected to the second input. The first and second signal detectors compare amplitudes of the first and second input signals in each case with a detection threshold and provide detector output signals including a first detector output signal from the first signal detector and a second detector output signal from the second signal detector. The first and second signal detectors each have a control input for setting the detection threshold. The control input of the first signal detector is coupled to an output of the second signal detector and the control input of the second signal detector is coupled to an output of the first signal detector. A signal processing circuit is connected to the detector circuit and receives the detector output signals. The signal processing circuit generates the output signal according to the detector output signals.

The receiver circuit according to the invention for a push-pull transmission method contains a first input for feeding in a first input signal and a second input for feeding in a second input signal and an output for providing an output signal depending on the first and second input signals, a detector circuit connected downstream of the inputs, and a signal processing circuit connected between the detector circuit and the output. The detector circuit contains a first signal detector connected to the first input and a second signal detector connected to the second input, the signal detectors comparing amplitudes of the input signals in each case with a detection threshold and providing a detector output signal dependent on the comparison. In this case, the signal detectors each contain a control input for setting the detection threshold, the control input of the first signal detector being coupled to the output of the second signal detector and the control input of the second signal detector being coupled to the output of the first signal detector. The setting of the detection threshold and the coupling of the two signal detectors make it possible, in the event of detection of an input pulse by one of the signal detectors, to lower the detection threshold of the respective other signal detector. This makes it possible to detect common-mode interference signals having different amplitudes provided that the amplitude of the interference signal on one channel lies above a first detection threshold, which represents the basic detection threshold of the signal detectors, in which case the interference signal on the other channel can be smaller than the first detection threshold but must be larger than the second detection threshold.

The signal detectors are preferably configured as Schmitt triggers with an adjustable upper switching threshold, the signal detectors compare the input signals with the first detection threshold or the second detection threshold according to a control signal present at the respective control input and provide a corresponding detector output signal.

In order to suppress common-mode interference signals which occur with a temporal offset on the transmission channels coupled to the inputs of the receiver circuit, the invention provides a receiver circuit having a first input for feeding in a first input signal and a second input for feeding in a second input signal and an output for providing an output signal dependent on the first and second input signals. The inputs have a detector circuit connected downstream thereof, which provides detector output signals dependent on a comparison of the input signals with a detection threshold. Connected between the detector circuit and the output is a signal processing circuit, to which the detector output signals are fed and which provides the output signal according to the detector output signals. The signal processing circuit contains an edge evaluation unit, which detects predetermined edges of the detector output signals and provides intermediate signals dependent on the detector output signals and on a temporal spacing between a predetermined edge of the first detector output signal and a predetermined edge of the second detector output signal.

Preferably, the edge evaluation unit has a first asymmetric delay element, to which is fed a first signal dependent on the first detector output signal and the second detector output signal, and a second asymmetric delay element, to which is fed a second signal dependent on the second detector output signal and the first detector output signal. The delay elements forwarding first edges, for example rising edges, of the first and second signals with a first delay time and second edges, for example falling edges, of the first and second signals with a second delay time.

By such a signal processing unit having an edge evaluation unit, edges of the detector output signals which are relevant for the further processing can be ignored provided that two identical edges, that is to say two rising or two falling edges of the detector output signals, occur in a temporal spacing which is less than a predetermined minimum permissible spacing between two such edges. If the temporal spacing of the edges of two detector output signals lies within this time window, then it is assumed that these edges of the detector output signals result from common-mode interference signals with a slight temporal offset on the transmission channels and are therefore to be ignored in order to prevent an effect on the output signal.

The detector circuit with the two signal detectors which are coupled to one another and which have adjustable detection thresholds, and the signal processing unit with the edge evaluation unit are preferably used together in the receiver circuit in order on the one hand to identify common-mode interference signals having different amplitudes and on the other hand to eliminate common-mode interference signals having a slight temporal offset.

Of course, the detector circuit with the two coupled signal detectors can be combined with an arbitrary other signal processing circuit in a receiver circuit, and the signal processing circuit with the edge evaluation unit can, of course, be combined with an arbitrary other detector circuit in the receiver circuit.

Other features which are considered as characteristic for the invention are set forth in the appended claims.

Although the invention is illustrated and described herein as embodied in a receiver circuit for a push-pull transmission method and a method for receiver-end signal processing in push-pull transmission methods, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8 is a timing diagram showing exemplary temporal profiles of selected signals depicted in FIG. 7;

DESCRIPTION OF THE PREFERRED EMBODIMENTS

Figure 1:
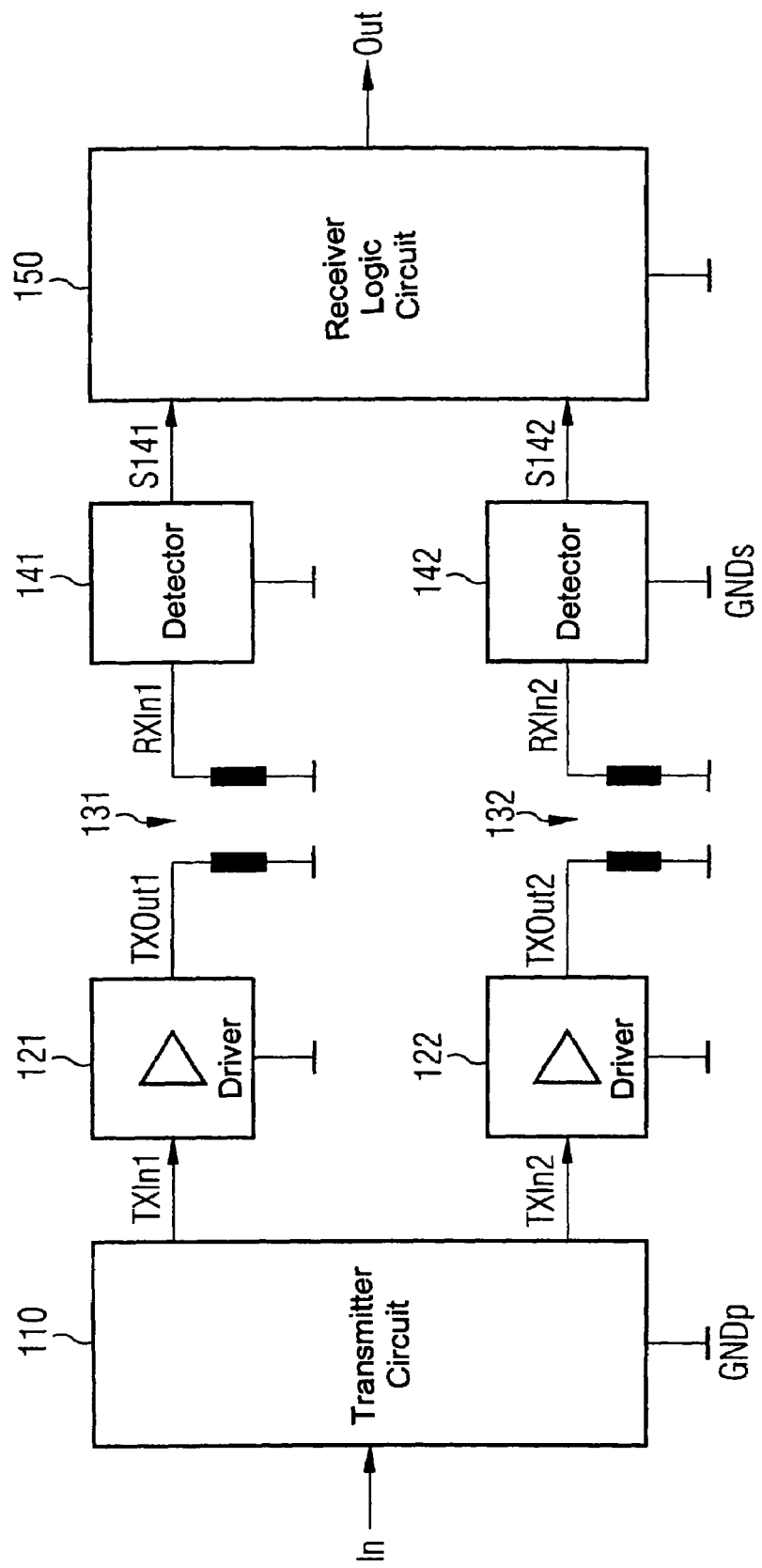
FIG. 1 is a block diagram showing a signal transmission path according to the prior art for a push-pull transmission method.
Figure 2:
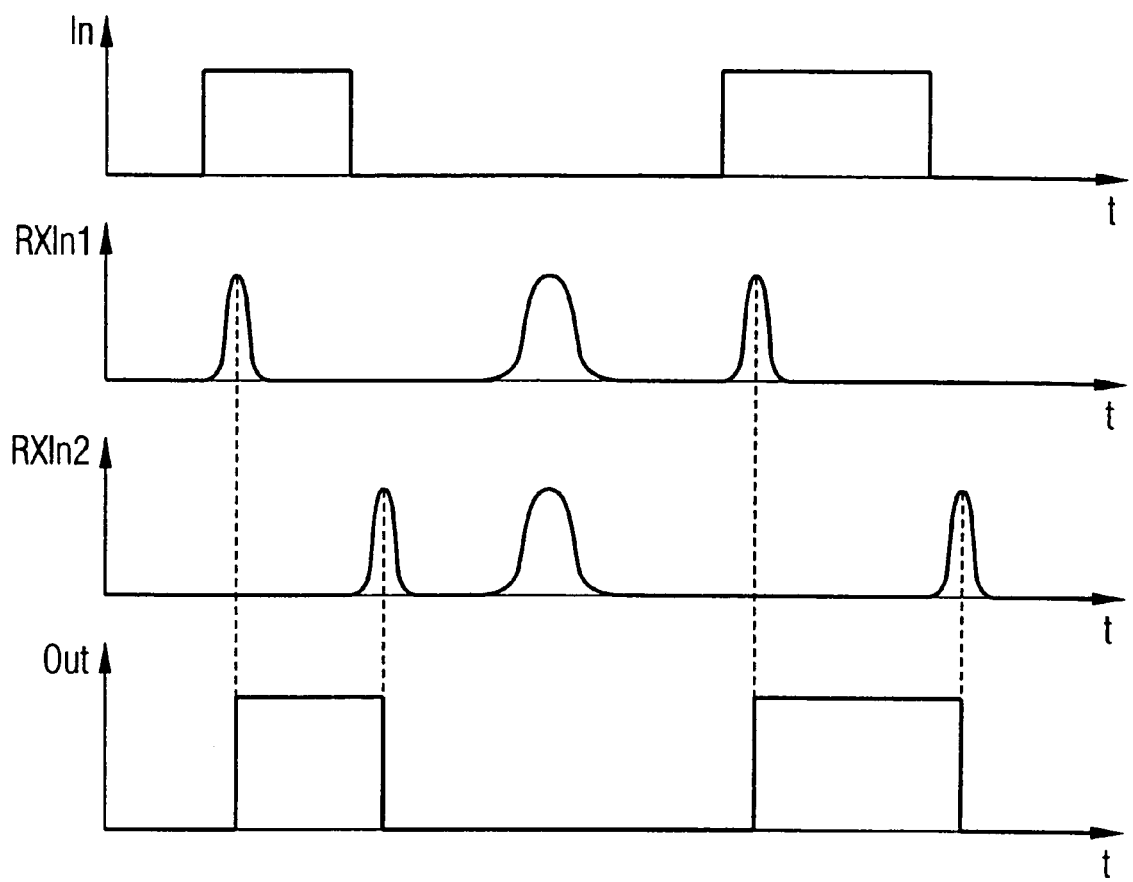
FIG. 2 is a graph showing signal profiles of selected signals depicted in FIG. 1.
Figure 3:
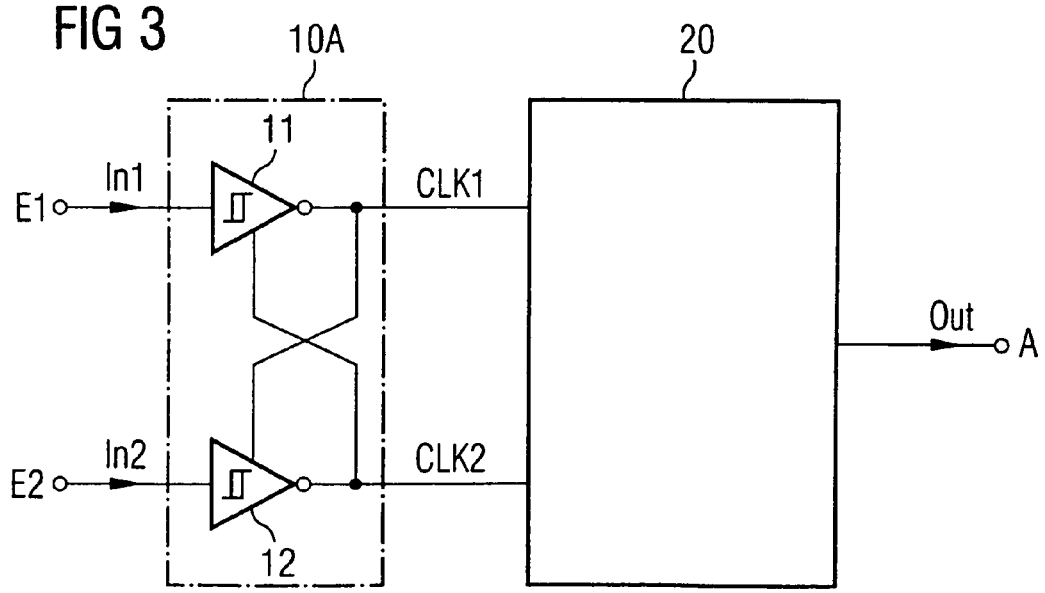
FIG. 3 is a block circuit diagram of an exemplary embodiment of a receiver circuit according to the invention, the receiver circuit having a detector circuit and a signal processing circuit.

In the figures, unless specified otherwise, identical reference symbols designate identical components and signals with the same meaning. Referring now to the figures of the drawing in detail and first, particularly, to FIG. 3 thereof, there is shown an exemplary embodiment of a receiver circuit according to the invention. The receiver circuit has input terminals E1, E2 for feeding in a first and second input signal In1, In2 and an output terminal A for providing an output signal Out dependent on the input signals In1, In2. The receiver circuit contains a detector circuit 10A, which is coupled to the inputs E1, E2 and provides first and second detector output signals CLK1, CLK2, which are fed to a signal processing unit 20 connected between the detector circuit 10A and the output A.

The detector circuit 10A contains a first detector 11, whose input is connected to the input terminal E1 and at whose output the first detector output signal CLK1 is available. The detector circuit 10A contains a second detector, whose input is connected to the second input terminal E2 and at whose output the second detector output signal CLK2 is available. The signal detectors 11, 12 are configured to compare the respective input signal In1, In2 with a detection threshold and to generate a two-value detector output signal CLK1 and CLK2, respectively, whose level is dependent on the comparison result. The detection thresholds of the signal detectors 11, 12 can be set via control inputs of the signal detectors 11, 12. In order to set the detection threshold, the control input of the second signal detector 12 is connected to the output of the first signal detector 11, and the control input of the first signal detector 11 is connected to the output of the second signal detector 12.

The mode of operation of the detector circuit 10A with two cross-coupled signal detectors 11, 12 is explained below with reference to FIG. 4 on the basis of exemplary temporal profiles for the first input signal In1, the second input signal In2 and the resultant detector output signals CLK1, CLK2 and the output signal Out. It being assumed that the two signal detectors 11, 12 are each configured as inverting Schmitt triggers having a lower switching threshold SL and an upper adjustable switching threshold. The upper switching threshold assuming a higher detection threshold value SH1 or a lower detection threshold value SH2 for the comparison with the input signals In1, In2 depending on a signal present at the control input of the respective signal detector 11, 12. In this case, the larger upper threshold value SH1 is used as the comparison value if an upper signal level is present at the respective control input of the signal detectors 11, 12, and the second signal threshold value SH2 is used as comparison value for the respective input signal In1 or In2 if a lower signal level is present at the respective control input of the signal detectors 11, 12.

The input signals In1, In2 contain a sequence of temporally successive pulses, in which case the pulses can result from transmitted useful signals and from interference signals. As long as no pulse is detected at the inputs E1, E2, the detector output signals CLK1, CLK2 assume an upper signal level but in this case, a respective detector output signal CLK1, CLK2 changes its state only when one of the input signals In1, In2 exceeds the larger of the two detection thresholds. In the example illustrated, a pulse that exceeds the larger upper detection threshold SH1 at the instant t1 is present at the first input terminal E1, as a result of which the first detector output signal CLK1 assumes a lower signal level (low level). In this case, the detector output signal CLK1 rises to an upper signal level (high level) again once the pulse present at the input E1 has fallen below the lower detection threshold SL. During this pulse at the first input terminal E1, no pulse is detected at the second input E2, with the result that the second detector output signal CLK2 remains at a high level. The signal processing circuit 20 evaluates the detector output signal CLK1, CLK2 and, with a falling edge of the first detector output signal CLK1 generates a rising edge of the output signal Out provided that the second detector output signal CLK2 remains at a high level during the falling edge of the first detector output signal and preferably within a period of time shortly before or shortly after the falling edge of the first detector output signal CLK1. An exemplary embodiment for such a signal processing circuit 20 will be explained below.

In the further course of events, a pulse that exceeds the larger upper detection threshold SH1 at an instant t3 and falls below the lower detection threshold SL at an instant t4 is present at the second input E2. The second detector output signal CLK2 correspondingly has a falling edge at the instant t3 and correspondingly has a rising edge at the instant t4. During the pulse at the second input E2, no pulse is present at the first input E1, with the result that the first detector output signal CLK1 remains at a high level. The signal processing circuit 20 generates a falling edge of the output signal Out with the falling edge of the second detector output signal CLK2 provided that the first detector output signal CLK1 has a high level during the falling edge of the second detector output signal CLK2 and preferably within a predetermined period of time before and after the falling edge of the second detector output signal CLK2.

In the further course of events, a common-mode interference signal occurs at the inputs E1, E2, the signal containing a pulse at the first input E1 and a pulse at the second input E2 that occur at the same time but have different amplitudes. The pulse at the first input E1 exceeds the larger upper detection threshold SH1 at an instant t5. So the resultant change in the detector output CLK1 to a low level the upper detection threshold of the second signal detector 12 is decreased from the larger value SH1 to the smaller value SH2. The pulse at the second input E2 exceeds the smaller upper signal threshold SH2, but not the larger upper signal threshold SH1, this pulse likewise being detected on account of the lowering of the upper detection threshold value in the second signal detector 12 at the instant t5 and a falling edge of the second detector output signal CLK2 being generated.

At the instant t5, falling edges both of the first and of the second detector output signal CLK1, CLK2 are present on account of the common-mode interference signal. The signal processing circuit 20 is configured to "ignore" falling edges of the detector output signals CLK1, CLK2 that occur simultaneously or in short temporal spacings and not to change the level of the output signal Out.

Figure 4:
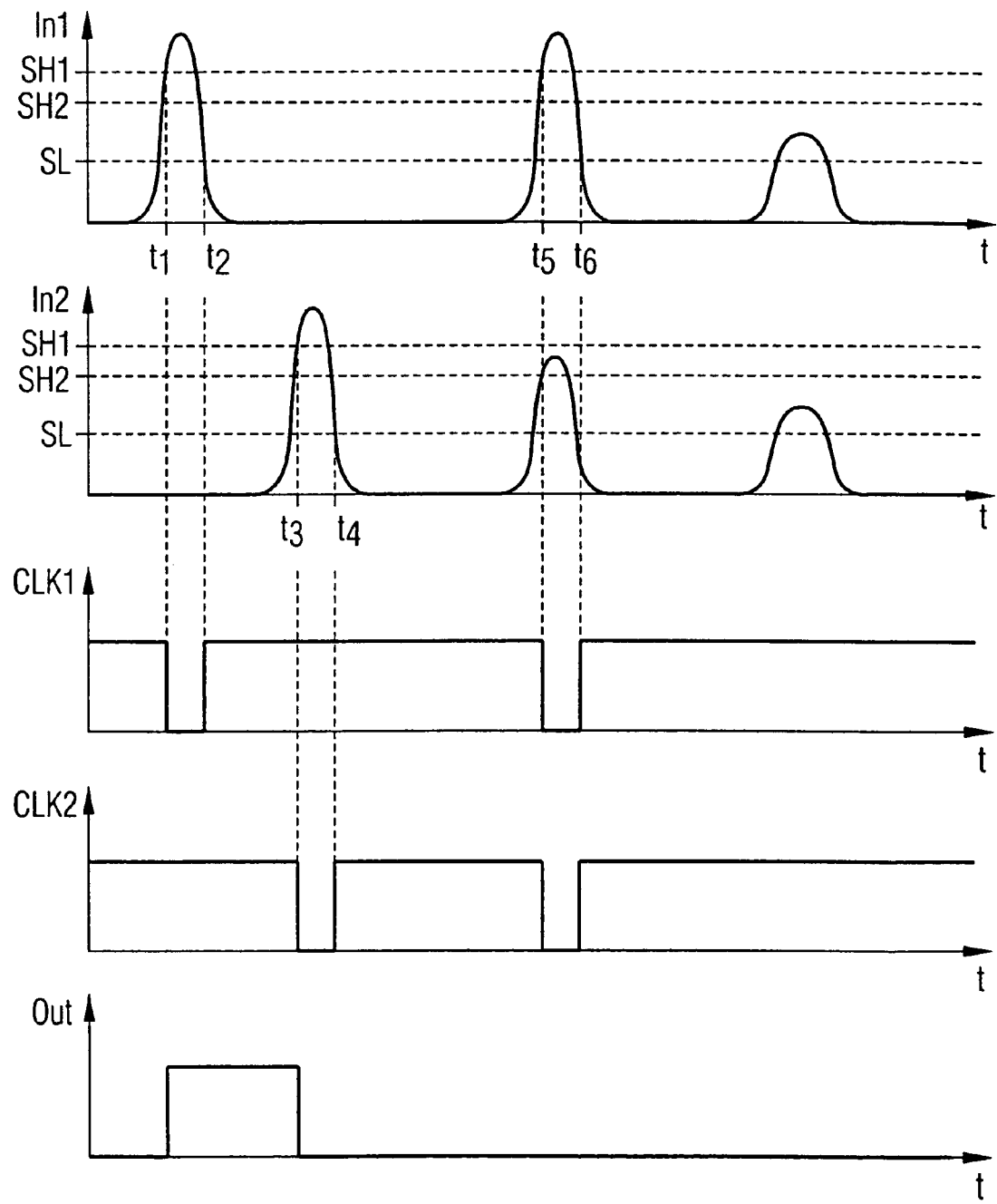
FIG. 4 is a graph showing exemplary signal profiles of selected signals depicted in FIG. 3.

As can be seen from the time profile in FIG. 4, the use of two cross-coupled signal detectors with an adjustable upper detection threshold has the effect that even common-mode interference signals with different amplitudes can be effectively suppressed. Without a reduction of the upper detection threshold of the second signal detector 12, the level of the second detector output signal CLK2 would have remained unchanged and the pulse at the first input E1 would have been identified as a useful signal in the signal processing circuit 20, which would have led to a change in the output signal Out.

Of course, the receiver circuit is not restricted to a two-channel embodiment with a first and second input E1, E2 and a first and second detector 11, 12. In the case of an embodiment (not specifically illustrated) with more than two channels and thus more than two detectors, the control input of one of the detectors is fed the output signals of the respective other detectors, these output signals being combined with one another in such a way that the change in the output signal of one of these other detectors suffices to lower the detection threshold of the one detector. In the case of connecting in parallel more than two detectors of the type illustrated in FIG. 3, in which the detection threshold changes given the presence of a low level at the control input and in which the output signal of a detector falls to a low level when an input signal is detected, in order to control one detector the output signals of the other detectors are combined with one another by an AND gate, for example.

Figure 5:
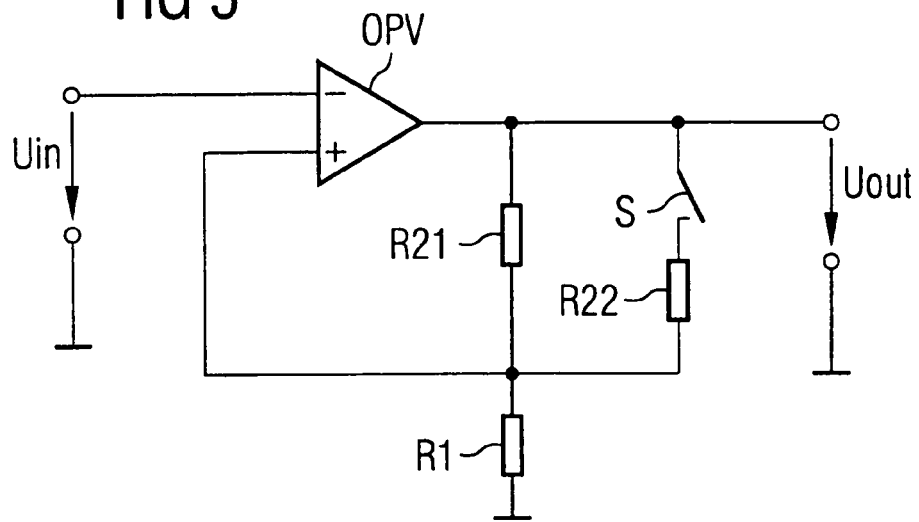
FIG. 5 is a circuit diagram of an exemplary embodiment for a circuitry realization of a signal detector with a variable detection threshold.

FIG. 5 shows an exemplary circuitry realization for an inverting Schmitt trigger with an adjustable upper detection threshold. The Schmitt trigger contains an operational amplifier OPV and a voltage divider with a series circuit formed by a first resistor R1 and a second resistor R21. The voltage divider is connected between the output of the operational amplifier OPV and reference-ground potential. A center tap of the voltage divider is fed back to the non-inverting input of the operational amplifier OPV. Connected in parallel with the second resistor R21 is a third resistor R22 in series with a switch S, the third resistor R22 being connected in parallel with the second resistor R21 according to the switch position of the switch. As is known, the switching threshold of such a Schmitt trigger is dependent on the divider ratio of the voltage divider, the divider ratio being able to be altered by the third resistor R22 that can be switched in. In this case, the switch is opened or closed according to a two-value control signal in order to set the switching threshold. An output voltage Uout which assumes an upper or a lower signal level according to an input signal Uin is available at the output of the Schmitt trigger, the dependence of the output signal Uout on the input signal Uin being determined by the divider ratio of the voltage divider.

Figure 6:
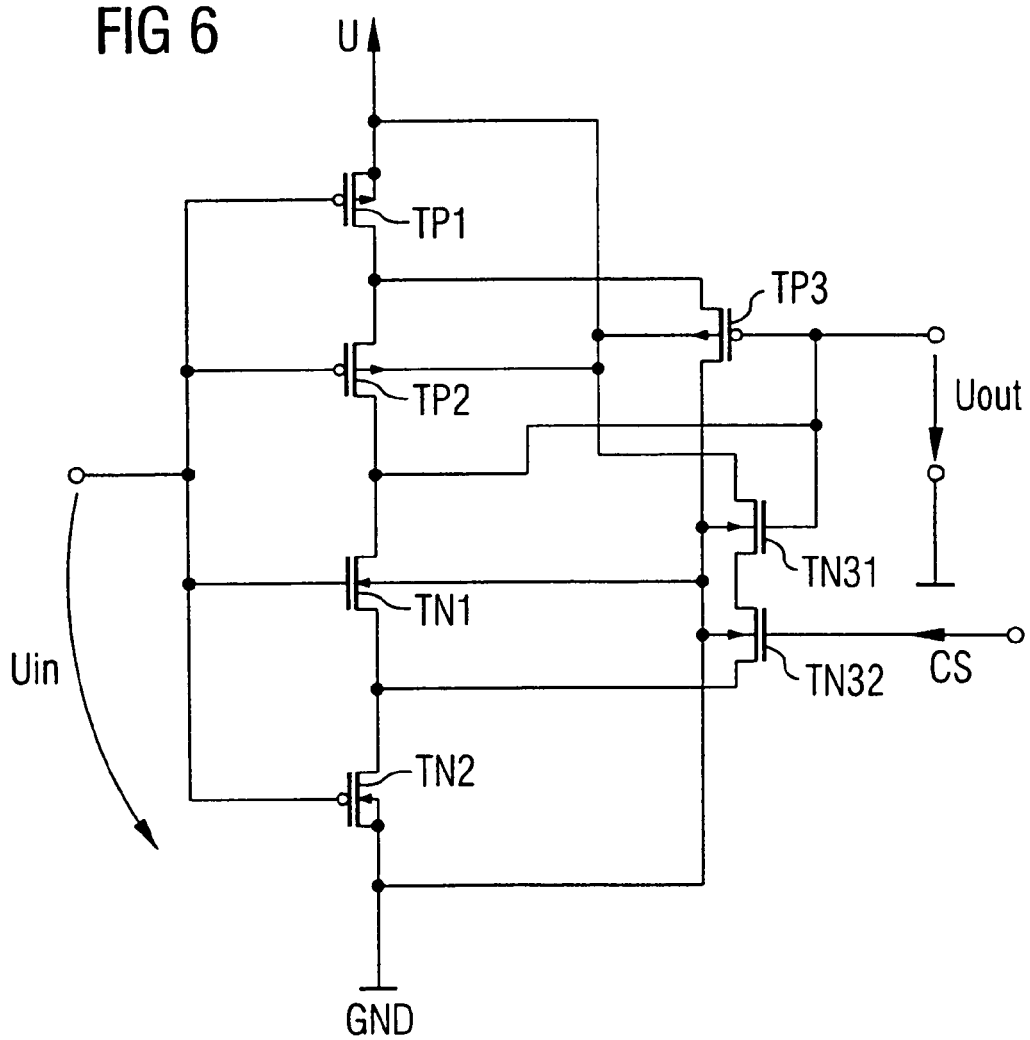
FIG. 6 is a circuit diagram showing a further exemplary embodiment of the signal detector with the variable detection threshold.

FIG. 6 shows a further exemplary circuitry realization for an inverting Schmitt trigger with an adjustable upper detection threshold. The Schmitt trigger contains an input stage with two p-channel transistors TP1, TP2 and two n-channel transistors TN1, TN2, whose load paths are connected in series between a supply potential V and a reference-ground potential GND and which are driven by an input voltage Uin referred to reference-ground potential GND. A node which is common to the series circuit containing the two p-channel transistors TP1, TP2 and the series circuit containing the two n-channel transistors TN1, TN2 forms an output of the Schmitt trigger, at which an output voltage Uout is present. In order to set a switching hysteresis of the Schmitt trigger, a further p-channel transistor TP3 is provided whose load path is connected between the reference-ground potential GND and a node common to the two p-channel transistors TP1, TP2 and which is driven by the output voltage Uout. In order to set the upper threshold voltage, in the exemplary embodiment, a first and second n-channel transistor TN31, TN32 are provided, whose load paths are connected between the supply potential V and a node common to the n-channel transistors TN1, TN2, the first transistor TN31 being driven by the output voltage Uout and the second transistor TN32 being driven by a control signal CS which influences the switching threshold. The control signal CS is chosen such that the transistor TN32 always conducts, but that the load path resistance of the transistor can assume a first large value and a second small value.

The mode of operation of the circuit configuration in accordance with FIG. 6 is now described. It shall first be assumed that the output signal Uout and the control signal CS have an upper signal level, as a result of which the transistors TN31 and TN32 conduct. If the input signal Uin rises, then first the n-channel transistor TN1 starts to conduct, the current flow through the first and second transistors TN31, TN32 bringing about a voltage drop across the load path of the transistor TN2, which voltage drop initially keeps the transistor TN2 turned off. If the input voltage Uin rises further until the load path resistance of the transistor TN2 and correspondingly the voltage drop across the load path thereof is so low that the transistor TN1 conducts, then the output signal falls to a low level. The input voltage Uin at which the transition of the output signal Uout to a low level takes place is dependent on the current supplied via the series circuit containing the first and second transistors TN31, TN32 and is thus dependent on the control signal CS.

Figure 7:
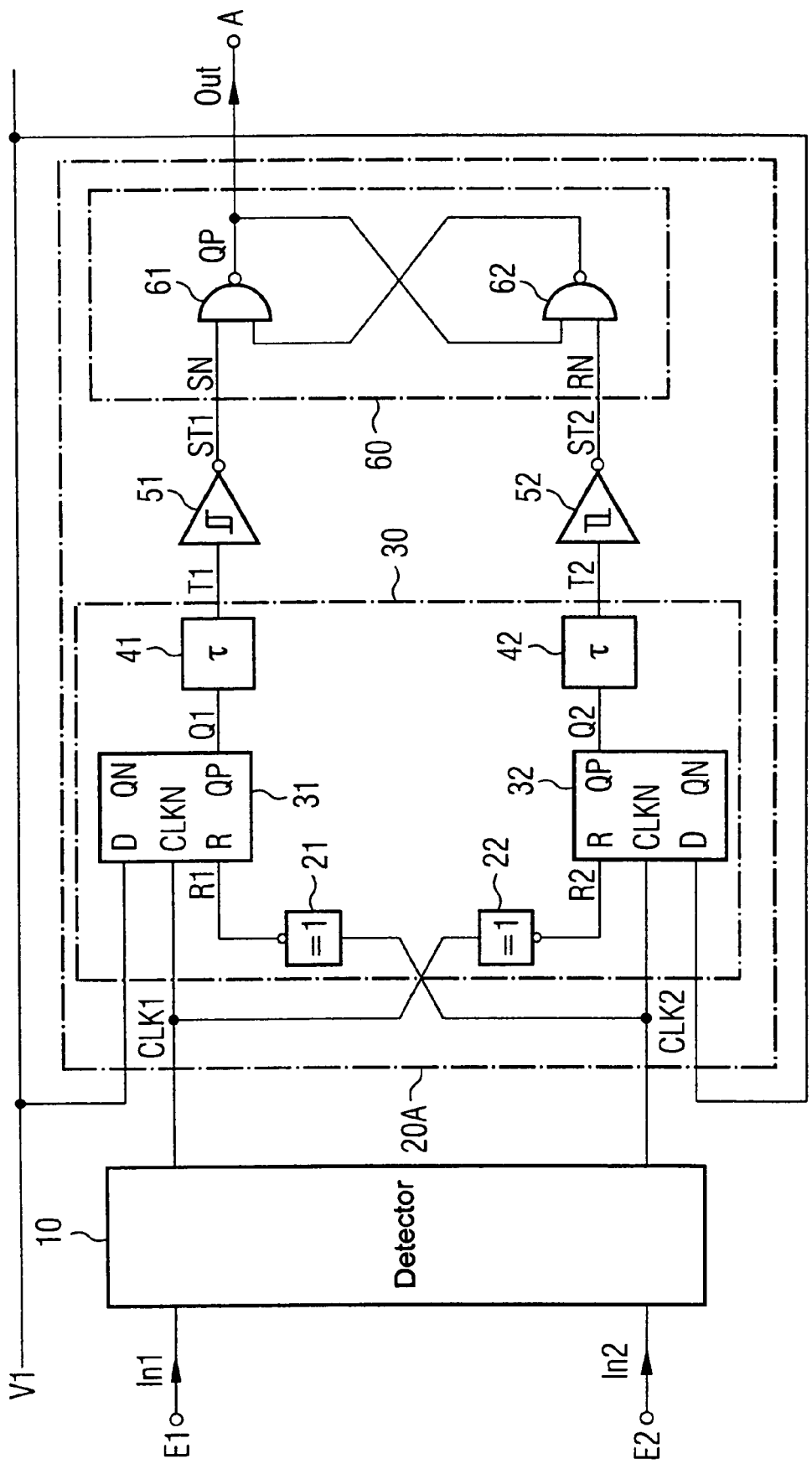
FIG. 7 is a circuit diagram of an exemplary embodiment of the receiver circuit with the detector circuit and a signal processing circuit according to the invention that is illustrated in detail.

FIG. 7 shows an exemplary embodiment of the receiver circuit according to the invention with a detector circuit 10 and a signal processing circuit 20A, which is connected downstream of the detector circuit 10 and is illustrated in detail and to which detector output signals CLK1, CLK2 of the detector circuit 10 are fed. The detector circuit 10 may be configured in accordance with the detector circuit 10A with two cross-coupled signal detectors illustrated in detail in FIG. 3. However, the detector circuit may be configured as any desired further detector circuit for detecting signal pulses at the inputs E1, E2 and for providing two-value detector output signals CLK1, CLK2 according to the input signals In1, In2. In this case, for the signal processing circuit 20A illustrated, the detector circuit 10 is configured such that, when a pulse is detected at the inputs E1, E2, the detector circuit in each case generates a falling edge of the associated detector output signal CLK1 or CLK2, respectively.

The signal processing circuit 20A is configured to generate an output signal Out according to the detector output signals CLK1, CLK2, the signal processing circuit 20A generating a rising edge of the output signal Out in the event of a falling edge of the first detector output signal CLK1 and a falling edge of the output signal Out in the event of a falling edge of the second detector output signal CLK2, and falling edges of the first and second detector output signals CLK1, CLK2 which occur within a predetermined time window being ignored in order to improve the suppression of common-mode interference signals.

The signal processing circuit 20A contains an edge spacing evaluation unit 30, through which the detector output signals CLK1, CLK2 are fed and which is constructed symmetrically. The edge spacing evaluation unit 30 contains a first asymmetric delay element 41, to which is fed a first signal Q1 dependent on the first detector output signal CLK1 and on the second detector output signal CLK2, and a second asymmetric delay element 42, to which is fed a second signal dependent on the second detector output signal CLK2 and the first detector output signal CLK1. In connection with the delay elements 41, 42, "asymmetric" means that the delay elements forward rising edges of the first and second signals Q1, Q2 with a different delay time than falling edges of the first and second signals Q1, Q2.

The first signal Q1 is available at the output of a first negative-edge-triggered D-type flip-flop 31, whose D input is connected to the supply potential V1 and at whose clock input CLKN the first detector output signal CLK1 is present. With each falling edge of the detector output signal CLK1, the flip-flop 31 sets the value of the positive supply potential V1, as a result of which the first signal Q1 receives a high level with each falling edge of the first detector output signal CLK1. The flip-flop 31 is reset depending on the second detector output signal CLK2 via an inverter 21 with each falling edge of the second detector output signal CLK2. The symmetrically constructed edge spacing evaluation unit 30 contains a further D-type flip-flop, whose D input is connected to the positive supply potential V1, whose clock input CLKN is fed the second detector output signal CLK2 and whose reset input R is fed the first detector output signal CLK2 inverted by an inverter 22.

The signal processing circuit 20A contains an output stage 60 in addition to the edge spacing evaluation unit 30, which output stage is configured as a low-level-triggered flip-flop 60 with two cross-coupled NAND gates 61 in the exemplary embodiment. The flip-flop 60 contains a set input SN and a reset input RN and an output QP formed by the output of the NAND gate 61. With each low level of a signal ST1 present at the set input SN, the output signal Out assumes an upper signal level, and with each low level of a signal present at the reset input RN, the output signal Out assumes a low level.

In the exemplary embodiment, inverting Schmitt triggers 51, 52 are respectively connected between the outputs of the asymmetric delay elements 41, 42 and the set and reset inputs SN and RN, respectively, of the output flip-flop 60. The Schmitt triggers 51, 52 can be dispensed with provided that it is ensured that the asymmetric delay elements 41, 42 supply stable signal levels, the output stage 60 being configured as a high-level-triggered flip-flop in the event of the Schmitt triggers being dispensed with.

The mode of operation of the signal processing circuit 20A with the edge spacing evaluation unit 30 is explained below on the basis of exemplary temporal profiles of the first and second detector output signals CLK1, CLK2 and the resultant first and second signals Q1, Q2, the output signals T1, T2 of the asymmetric delay elements 41, 42, input signals ST1, ST2 of the output stage 60 and the output signal Out in FIG. 8.

The detector output signals CLK1, CLK2 generated by the detector circuit 10 at the input of the receiver circuit are logic signals which predominantly have a high level and assume a low level when a pulse is detected at the inputs E1, E2.

The first detector output signal CLK1 has a falling edge at the instant t11 in the exemplary signal profile. This results in a rising edge of the first signal Q1 present at the output of the flip-flop 31. Furthermore, with the falling edge of the first detector output signal CLK1, the flip-flop 32 is reset via the inverter 22, which results in a falling edge of the second signal Q2. The asymmetric delay elements 41, 42 are preferably constructed identically and configured such that they forward rising edges of the signals Q1, Q2 present at their inputs to their output with a first delay duration Δth, and that they forward falling edges of the input signals Q1 and Q2, respectively, to the output with a second delay time Δtl, which is less than the first delay time Δth. Consequently, a rising edge of the output signal T1 of the first asymmetric delay element 41 is present at an instant t11+Δth and a falling edge of the output signal T2 of the second asymmetric delay element 42 is present at the instant t11+Δtl. Gate transit times which occur in addition to the delay times of the delay elements 41, 42 have been disregarded in the context of this explanation.

Given the presence of stable signal levels of the output signals T1, T2 of the delay elements 41, 42, the signals ST1, ST2 present at the inputs SN, RN of the output stage 60 correspond to the inverted output signals T1, T2 of the delay elements. The rising edge of the output signal T1 of the delay element 41 at the instant t11+Δth thus results in a falling edge of the signal ST1 at the output of the Schmitt trigger 51, as a result of which the flip-flop 60 is set and the output signal Out assumes a high level.

A falling edge of the second detector output signal CLK2 is present at the instant t12. This results in a rising edge of the second signal Q2 at the output of the flip-flop 32 and a falling edge of the first signal Q1 at the output of the flip-flop 31, which is reset with the falling edge of the second detector output signal CLK2. A falling edge of the output signal T1 of the first delay element 41 is present in time-delayed fashion at the instant t12+Δt1, while a rising edge of the output signal T2 of the second delay element 42 is present in time-delayed fashion at an instant t12+Δth. Owing to the resultant falling edge of the signal ST2 at the input of the reset input RN of the flip-flop 60, the flip-flop 60 is reset and the output signal Out assumes a lower signal level.

In the case of the time profiles explained heretofore, the temporal spacing between the falling edges of the first and second detector output signals CLK1, CLK2 is in each case greater than the delay times Δt1 and Δth, respectively, of the asymmetric delay elements 41, 42. In the further signal profile of the detector output signals CLK1, CLK2, falling edges of the detector output signals occur at the instant t13 and, respectively, in temporally offset fashion at the instant t13+Δt. In this case, the width of the low pulses of the detector output signals CLK1, CLK2 is greater than the time offset Δt. This results in a high pulse of the first signal Q1 having the width Δt and a resetting of the second signal Q2 to low. The temporal spacing Δt between the falling edges of the detector output signals CLK1, CLK2 is less than the delay duration Δth with which delay elements forward rising edges of the input signals Q1 and Q2, respectively. Correspondingly, the pulse of the input signal Q1 starting from the instant t13 does not lead to a corresponding pulse of the output signal T1 of the delay element 41. The signal at the set input SN of the flip-flop 60 thus remains unchanged, as a result of which the output signal Out does not change. The level of the second signal Q2 has no effect on the output signal Out.

If it is not ensured that the width of the low pulses of the detector output signals CLK1, CLK2 is not greater than the time offset Δt, an asymmetric delay element in accordance with the delay elements 41, 42 is also to be provided in each case upstream of the reset inputs R of the flip-flops 31, 32.

The signal processing circuit 20A with the edge spacing evaluation unit 30 as illustrated in FIG. 7 is able, on account of the asymmetric delay elements 41, 42, to "mask out" falling edges of the detector output signals CLK1, CLK2 which occur within a time window which is shorter than the delay time Δth with which the delay elements 41, 42 forward rising edges of the first and second signals Q1, Q2. Common-mode interference signals which bring about temporally offset pulses at the inputs E1, E2 and which are detected in the detection circuit 10 can thus be masked out in the signal processing unit 20A.

Figure 9A:
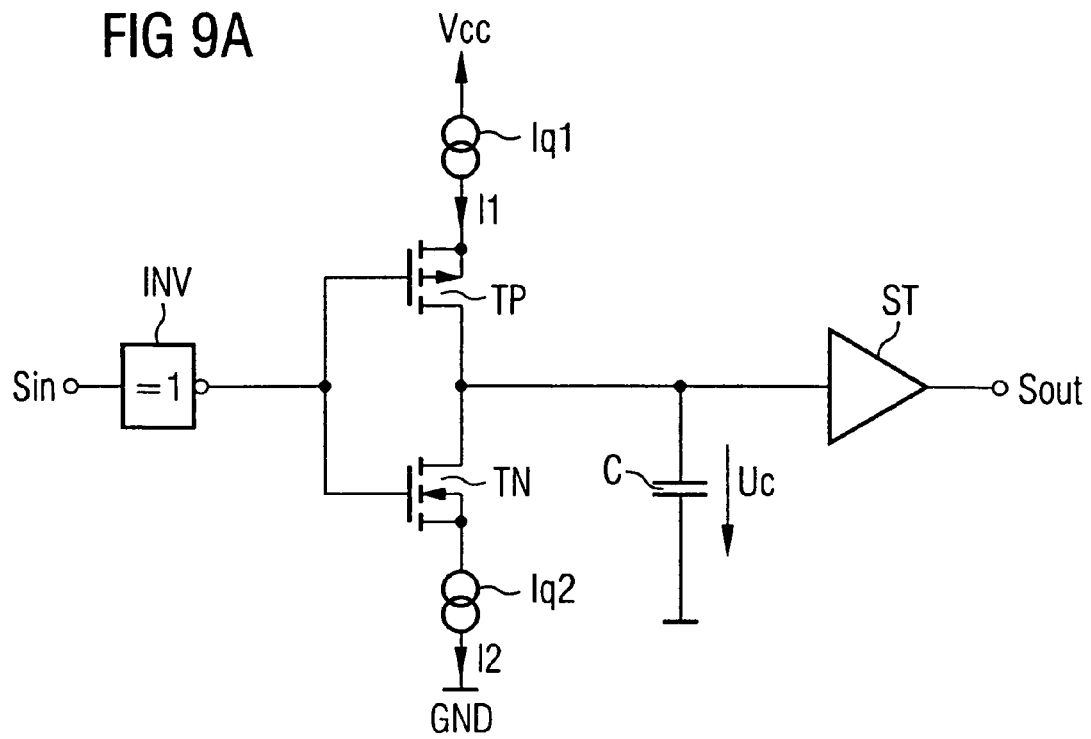
FIG. 9A is a circuit diagram of an exemplary circuitry realization of an asymmetric delay element.

FIG. 9A shows an exemplary circuitry realization of an asymmetric delay element which forwards rising edges of an input signal Sin with a first delay time and falling edges of the input signal Sin with a second delay time to an output signal Sout. The delay element contains a series circuit having a first current source Iq1 and a p-channel transistor TP and also a series circuit having an n-channel transistor TN and a second current source Iq2, these series circuits being connected in series between a supply potential Vcc and reference-ground potential GND. The two transistors TP, TN are driven by the input signal Sin. A capacitor C is connected between a node N1 common to the two transistors TP and TN and reference-ground potential GND. A Schmitt trigger ST with an upper detection threshold Vh and a lower detection threshold V1 compares a voltage Uc across the capacitor C with said detection thresholds and provides the output signal Sout.

Figure 9B:
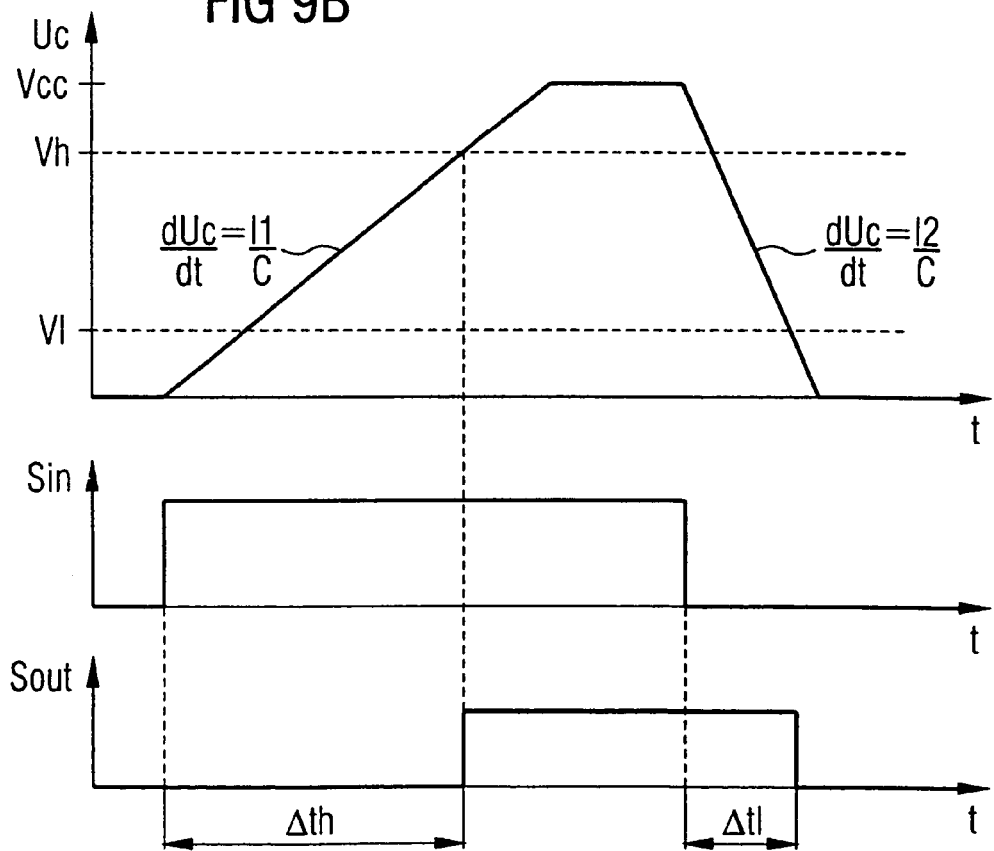
FIG. 9B is a timing diagram of the asymmetric delay element.

FIG. 9B shows temporal profiles for the input signal Sin and the output signal Sout dependent thereon for the delay element illustrated in FIG. 9A. If the input signal Sin assumes a high level, then the low-side transistor TN turns off and the capacitor C is charged with a current I1 by the current source Iq1, as a result of which the voltage across the capacitor Uc rises linearly. If this voltage reaches the value of the upper detection threshold Vh, then the output signal Sout assumes a high level. The delay duration Δth between the rising edge of the input signal Sin and the rising edge of the output Sout is proportional to the current I1 and the upper detection threshold Vh of the Schmitt trigger ST. The capacitor C is also charged up to the supply voltage Vcc in the further course of events.

If the input signal Sin subsequently assumes a low level, then the high-side transistor TP turns off and the low-side transistor TN conducts, as a result of which the capacitor C is discharged by a current I2 supplied by the current source Iq2. In this case, the output signal Sout assumes a low level as soon as the voltage Uc across the capacitor C has fallen below the value of the lower detection threshold V1. The delay time between a falling edge of the input signal Sin and a falling edge of the output signal Sout is dependent on the difference between the supply voltage Vcc and the lower switching threshold VL and proportional to the second current I2. The second current I2 has a greater magnitude than the first current I1, in order that the capacitor C is discharged more rapidly than it is charged, this resulting in different delay times for rising edges and falling edges of the input signal Sin.

An exemplary embodiment that is not specifically illustrated provides for the second current source I2 to be dispensed with, as a result of which falling edges of the input signal Sin are forwarded virtually without any delay, since the capacitor C is short-circuited with conducting driving of the low-side transistor TN.

Figure 10:
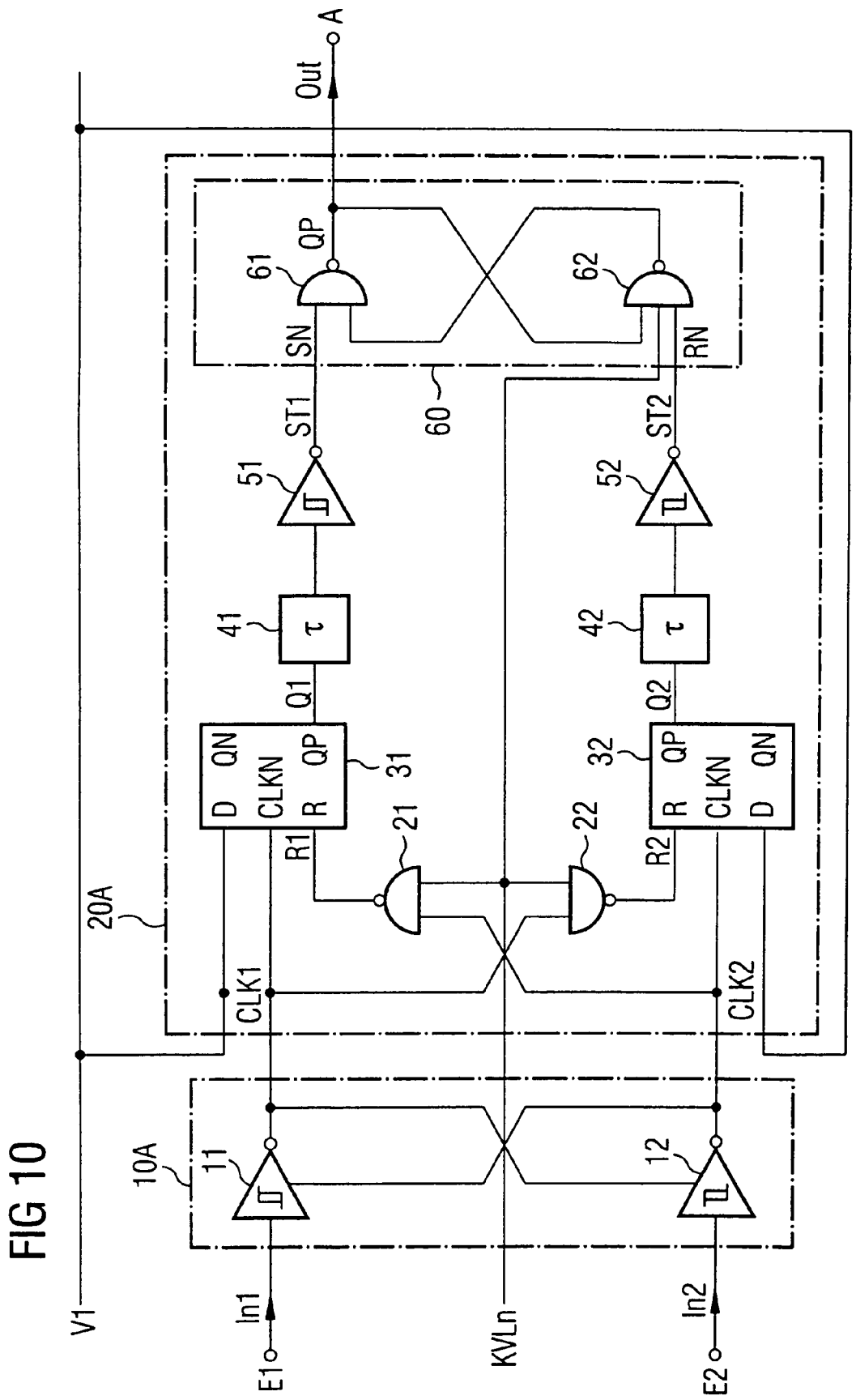
FIG. 10 is a circuit diagram of a receiver circuit with a detector circuit having two coupled signal detectors and a signal processing circuit with two edge evaluation units.

The detector circuit with the cross-coupled signal detectors 11, 12 and the signal processing circuit 20A are preferably combined with the edge spacing evaluation unit 30, as is illustrated for a receiver circuit according to the invention in FIG. 10. In this case, the detector circuit 10A is able to detect common-mode interference signals having different amplitudes, while the signal processing circuit 20A connected downstream is able to suppress common-mode interference signals that occur with a slight temporal offset with respect to one another. In this case, the signal processing circuit 20A is also able to take account of signal delays which, if appropriate, are present in the detector circuit and, even in the case of pulses that are present simultaneously at the inputs E1, E2, can lead to detector output signals CLK1, CLK2 with a slight temporal offset. In the exemplary embodiment in accordance with FIG. 10, the inverters 21, 22 in accordance with FIG. 7 are replaced by NAND gates 21, 22, to which a supply voltage detection signal UVLn is fed. The supply voltage detection signal UVLn has a high level in the case of a sufficient supply voltage and assumes a low level in the case of an excessively low supply voltage in order thereby to reset the flip-flops 31, 32 and the output flip-flops 60 and to transfer them into a defined switching state before a reswitching-on process.

Figure 11:
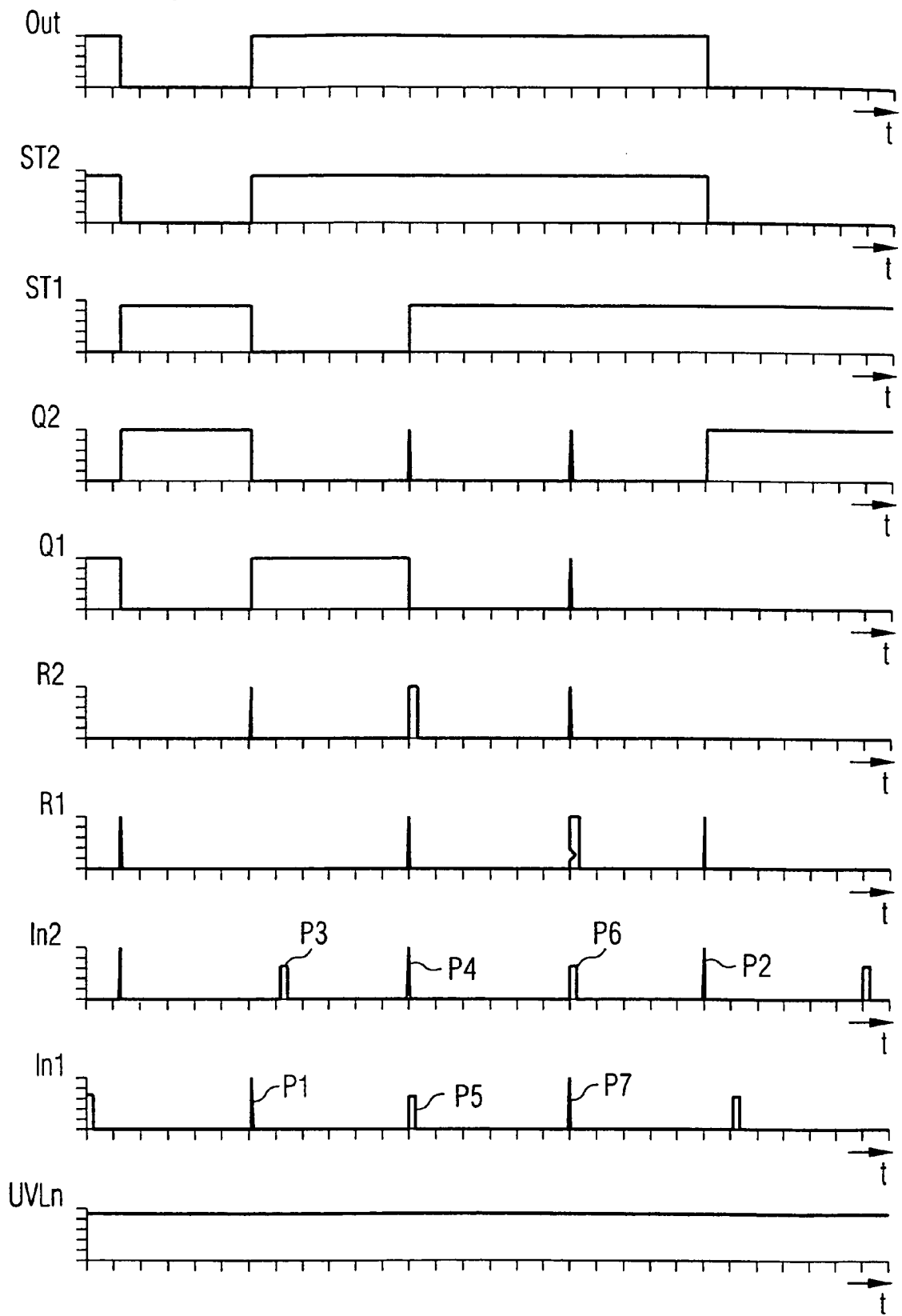
FIG. 11 is a timing diagram showing exemplary temporal profiles of selected signals depicted in FIG. 10.

FIG. 11 shows exemplary temporal profiles of selected signals in the circuit according to FIG. 10.

In FIG. 11, P1 and P2 designate useful signal pulses of the input signals In1 and In2, respectively, the pulse P1 leading to a rising edge of the output signal Out and the pulse P2 leading to a falling edge of the output signal Out2. Between these pulses, interference pulses occur in the input signals In1, In2, but do not lead to a change in the output signal Out. The interference pulse P3, which occurs only in the signal In2, lies below the detection threshold of the signal detector 12 and therefore does not lead to a change in the output signal. The interference pulses P4, P5 occur with a slight temporal offset relative to one another and with different amplitudes, but are detected because one of the pulses lies above the higher upper detection threshold of the second signal detector 12 and the interference pulse P5 in the first input signal In1 is likewise identified after a reduction of the detection threshold by the first signal detector. The time delay between these two pulses is compensated for by the edge spacing evaluation unit 30 with the asymmetric delay elements. The same applies correspondingly to the interference pulses P6, P7, which likewise occur with a slight temporal offset and with different amplitudes.

Figure 12:
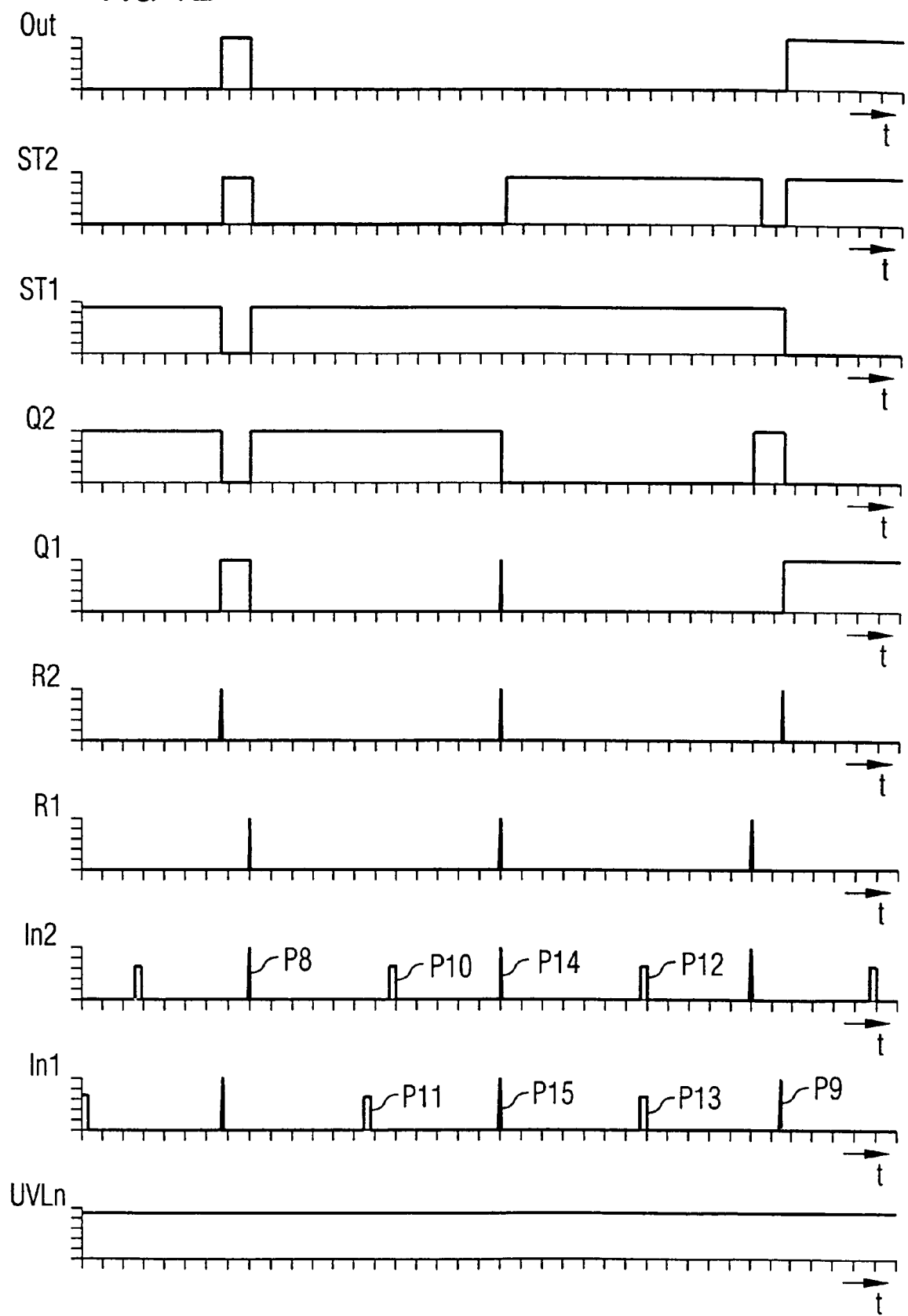
FIG. 12 is a timing diagram showing exemplary temporal profiles of selected signals depicted in FIG. 10.

FIG. 12 shows further exemplary time profiles, a pulse P8 of the first input signal In1 representing a useful signal pulse which leads to a falling edge of the output signal Out1, and a pulse P9 of the second input signal In2 representing a useful pulse which leads to a rising edge of the output signal Out1. The pulses P10, P11 lie below the detection threshold of the signal detectors 11, 12 and are therefore not detected. The same applies to the pulses P12, P13. FIG. 12 furthermore illustrates common-mode interference pulses P14, P15 which occur simultaneously, with the reset pulses R1, R2 of the flip-flops 31, 32 occurring with a time offset on account of gate transit times in the detector circuit 10A and/or the signal processing unit 20, which results in a rising edge of the first signal Q1. The pulse width of this signal Q1 is small, however, in comparison with the delay time of the asymmetric delay element 41, so that this pulse of the first signal Q1 does not affect the output signal Out.

I claim:

1. A receiver circuit for a push-pull transmission method, comprising:

at least one first input for receiving a first input signal;

at least one second input for receiving a second input signal;

an output providing an output signal dependent on the first and second input signals;

a detector circuit having a first signal detector connected to said first input and a second signal detector connected to said second input, said first and second signal detectors comparing amplitudes of the first and second input signals in each case with a detection threshold and providing detector output signals including a first detector output signal from said first signal detector and a second detector output signal from said second signal detector, said first and second signal detectors each having a control input for setting the detection threshold to at least a first value and a second value lower than the first value, said control input of said first signal detector being coupled to an output of the second signal detector and said control input of said second signal detector being coupled to an output of said first signal detector; and a signal processing circuit connected to said detector circuit and receiving the detector output signals, said signal processing circuit generating the output signal according to the detector output signals;

after an amplitude of one of the first and second input signals exceeds the first value of the detection threshold, the detection threshold compared to another one of the first and second input signals being decreased to the second value of the detection threshold.

2. The receiver circuit according to claim 1, wherein the detection threshold is set to the first value or the second value according to a signal present at said control input.

3. The receiver circuit according to claim 1, wherein said first and second signal detectors are Schmitt triggers with an adjustable upper switching threshold.

4. The receiver circuit according to claim 1, wherein said signal processing circuit has an edge spacing evaluation unit for detecting predetermined edges of the detector output signals and provides further output signals dependent on the detector output signals and on a temporal spacing between a predetermined edge of the first detector output signal and a predetermined edge of the second detector output signal.

5. The receiver circuit according to claim 4, wherein said edge spacing evaluation unit has a first asymmetric delay element receiving a first signal dependent on the first detector output signal and the second detector output signal, and a second asymmetric delay element receiving a second signal dependent on the second detector output signal and the first detector output signal, said first and second asymmetric delay elements forwarding first edges of the first and second signals with a first delay time and second edges of the first and second signals with a second delay time.

6. The receiver circuit according to claim 5, wherein said first and second asymmetric delay elements forward falling edges of the first and second signals with a greater delay time than rising edges.

7. The receiver circuit according to claim 1, wherein said first and second inputs are two of a plurality of inputs connected to said detector circuit, said detector circuit having a plurality of signal detectors each connected to one of said inputs, said control input of a respective one of said signal detectors having applied to it a signal dependent on output signals of other ones of said signal detectors.

8. A method for detecting a first signal and a second signal in a push-pull transmission method, which comprises the steps of:
    comparing the first and second signals in each case with a detection threshold having a first value;
    comparing one of the first and second signals with a detection threshold having a second value being lower than the first value after the other of the first and second signals has reached the detection threshold with the first value.

9. The method according to claim 8, which further comprises increasing the detection threshold to the first value for comparing with the one signal after the other signal has reached a detection threshold having a third value.

10. The method according to claim 9, which further comprises setting the third value to be less than the first and second values.

11. A receiver circuit for a push-pull transmission method, comprising:
    a first input for receiving a first input signal;
    a second input for receiving a second input signal;
    an output providing an output signal dependent on the first and second input signals;
    a detector circuit connected to said first input and said second input and providing detector output signals dependent on a comparison of the first and second input signals with a detection threshold settable to at least a first value and a second value lower than the first value, said detector output signals include a first detector output signal and a second detector output signal, after one of the first and second input signals exceeds the first value of the detection threshold, the detection threshold compared to another one of the first and second input signals being decreased to the second value of the detection threshold; and
    a signal processing circuit coupled to said detector circuit and said output, said signal processing circuit receiving the detector output signals and generating the output signal according to the detector output signals, said signal processing circuit having an edge evaluation unit for detecting predetermined edges of the detector output signals and providing intermediate signals dependent on the detector output signals and on a temporal spacing between a predetermined edge of the first detector output signal and a predetermined edge of the second detector output signal.

12. The receiver circuit according to claim 11, wherein said edge evaluation unit has a first asymmetric delay element receiving a first signal dependent on the first detector output signal and the second detector output signal, and a second asymmetric delay element receiving a second signal dependent on the second detector output signal and the first detector output signal, said first and second asymmetric delay elements forwarding first edges of the first and second signals with a first delay time and second edges of the first and second signals with a second delay time.

13. The receiver circuit according to claim 12, wherein said first and second asymmetric delay elements forward falling edges of the first and second signals with a greater delay time than rising edges.

\* \* \* \* \*